United States Patent
Kim et al.

(10) Patent No.: US 9,754,705 B2
(45) Date of Patent: Sep. 5, 2017

(54) RESISTOR, METHOD OF MANUFACTURING THE SAME, AND BOARD HAVING THE SAME

(71) Applicant: SAMSUNG ELECTRO-MECHANICS CO., LTD., Suwon-Si, Gyeonggi-Do (KR)

(72) Inventors: Hae In Kim, Suwon-Si (KR); Jung Min Nam, Suwon-Si (KR); Jea Hoon Lee, Suwon-Si (KR); Young Key Kim, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/931,684

(22) Filed: Nov. 3, 2015

(65) Prior Publication Data

US 2016/0125981 A1     May 5, 2016

(30) Foreign Application Priority Data

Nov. 4, 2014   (KR) .................. 10-2014-0152411

(51) Int. Cl.
| | |
|---|---|
| *H01C 1/14* | (2006.01) |
| *H01C 1/01* | (2006.01) |
| *H01C 7/00* | (2006.01) |
| *H01C 17/28* | (2006.01) |
| *H05K 1/18* | (2006.01) |
| *H05K 3/34* | (2006.01) |

(52) U.S. Cl.
CPC ............. *H01C 1/14* (2013.01); *H01C 1/01* (2013.01); *H01C 7/003* (2013.01); *H01C 17/281* (2013.01); *H05K 1/181* (2013.01); *H05K 3/3431* (2013.01); *H05K 2201/10022* (2013.01); *H05K 2201/10045* (2013.01)

(58) Field of Classification Search
CPC .......... H01C 1/01; H01C 17/28; H01C 17/00; H01C 13/02; H01C 7/003
USPC .................. 338/309, 313, 325, 327, 332
See application file for complete search history.

(56) References Cited

U.S. PATENT DOCUMENTS

| | | | | |
|---|---|---|---|---|
| 3,876,912 A | * | 4/1975 | Sanders ................. | H01C 13/02 338/309 |
| 3,996,551 A | * | 12/1976 | Croson .................. | H01C 7/006 216/16 |
| 5,179,366 A | * | 1/1993 | Wagner .................. | H01C 1/084 338/308 |
| 5,977,863 A | * | 11/1999 | Bloom .................... | H01C 7/006 257/E23.175 |

(Continued)

FOREIGN PATENT DOCUMENTS

| | | |
|---|---|---|
| JP | 5-251202 A | 9/1993 |
| JP | 2000-150204 A | 5/2000 |
| KR | 10-2013-0070682 A | 6/2013 |

*Primary Examiner* — Kyung Lee
(74) *Attorney, Agent, or Firm* — McDermott Will & Emery LLP

(57) ABSTRACT

A resistor includes: a base substrate; a resistance layer disposed on one surface of the base substrate; first and second electrode layers disposed to be spaced apart from each other and covering portions of the resistance layer; and a third electrode layer disposed between the first and second electrode layers to be spaced apart from the first and second electrode layers and covering a portion of the resistance layer.

14 Claims, 11 Drawing Sheets

(56) References Cited

U.S. PATENT DOCUMENTS

| | | | |
|---|---|---|---|
| 6,097,276 A * | 8/2000 | Van Den Broek | H01C 7/06 338/22 R |
| 6,314,637 B1 * | 11/2001 | Kimura | H01C 1/142 29/610.1 |
| 6,368,734 B1 | 4/2002 | Mihara et al. | |
| 7,193,499 B2 * | 3/2007 | Tsukada | H01C 1/144 338/309 |
| 8,081,059 B2 * | 12/2011 | Tanimura | H01C 1/148 338/307 |
| 8,098,127 B2 * | 1/2012 | Tchaplia | H01P 5/16 338/254 |
| 8,581,687 B2 * | 11/2013 | Belman | H01C 1/16 29/621.1 |
| 2005/0285713 A1 * | 12/2005 | Kuriyama | H01C 1/16 338/260 |
| 2009/0085715 A1 * | 4/2009 | Zandman | H01C 1/014 338/275 |
| 2009/0085716 A1 * | 4/2009 | Kim | H01C 1/14 338/325 |
| 2013/0154790 A1 | 6/2013 | Park et al. | |
| 2016/0125981 A1 * | 5/2016 | Kim | H01C 1/14 338/325 |

\* cited by examiner

RESISTOR, METHOD OF MANUFACTURING THE SAME, AND BOARD HAVING THE SAME

CROSS-REFERENCE TO RELATED APPLICATION

This application claims benefit of priority to Korean Patent Application No. 10-2014-0152411 filed on Nov. 4, 2014, with the Korean Intellectual Property Office, the disclosure of which is incorporated herein by reference.

TECHNICAL FIELD

The present disclosure relates to a resistor, a method of manufacturing the same, and a board having the same.

BACKGROUND

A resistor having a chip shape is suitable for implementing precise resistance, and serves to adjust the flow of current and a voltage drop in a circuit.

When a resistor is damaged by external impacts (surges, static electricity, or the like) in a circuit design including the resistor and a defect (short-circuit) occurs, all currents of a power supply flow in an integrated circuit (IC), and thus, secondary damage may occur in the circuit.

In order to prevent such a phenomenon, using a plurality of resistors in designing a circuit may be considered. However, in the circuit design as described above, a mounting area of a board may be increased.

Particularly, in mobile devices which have gradually been miniaturized and had precision implemented therein, an increase in a mounting area of a board is not preferable in view of circuit stability. Therefore, research into a resistor capable of more effectively adjusting a current flowing in the circuit has been required.

SUMMARY

An aspect of the present disclosure may provide a resistor, a method of manufacturing the same, and a board having the same.

According to an aspect of the present disclosure, a resistor may include: a base substrate; a resistance layer disposed on one surface of the base substrate; and first to third electrode layers disposed on the resistance layer. The electrode layers may be disposed on the resistance layer to increase an area of the resistance layer. In addition, non-uniformity of overlapping areas of the electrode layers and the resistance layer may be reduced.

According to another aspect of the present disclosure, a method of manufacturing a resistor may include: preparing a base substrate; forming a resistance layer on one surface of the base substrate; and forming first to third electrode layers to cover portions of the resistance layer, wherein the electrode layers are formed on the resistance layer, such that R-drift generated in a manufacturing process may be decreased even in the case that a resistance paste contains glass.

According to another aspect of the present disclosure, a board having a resistor may include: the resistor as described above; and a circuit board on which the resistor is mounted. When the resistor is mounted on a board, connectivity and adhesive strength between electrode pads disposed on the circuit board and terminals of the resistor may be improved.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
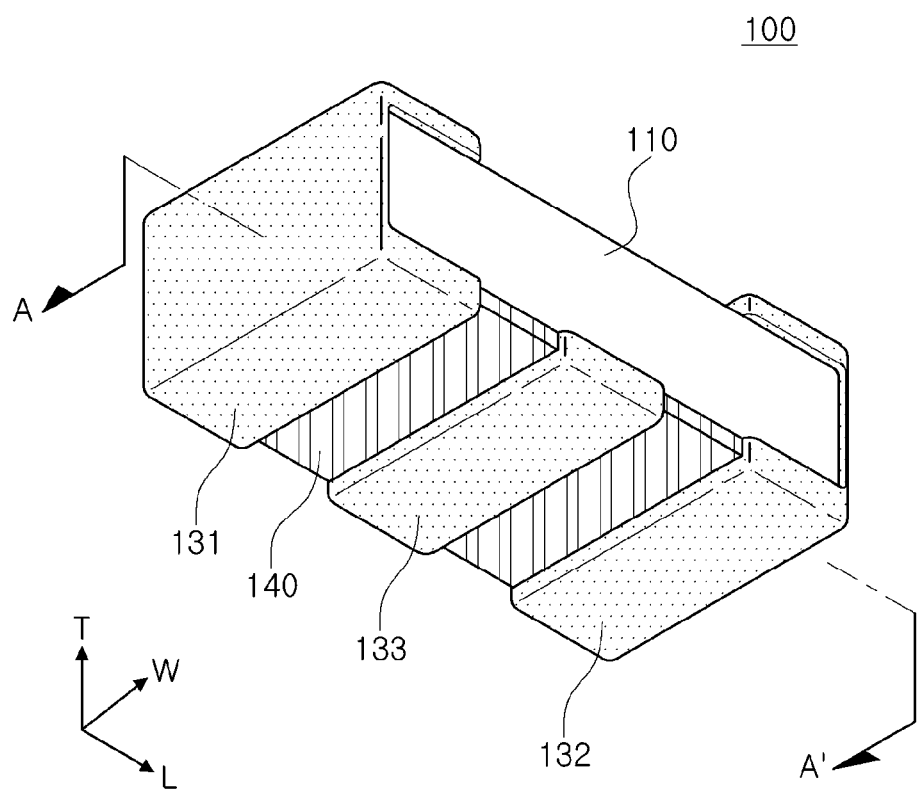
FIG. 1 is a perspective view illustrating a resistor according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

In the accompanying drawings, W, T, and L directions refer to a width direction, a thickness direction, and a length direction of a base substrate, respectively.

Resistor

Figure 2:
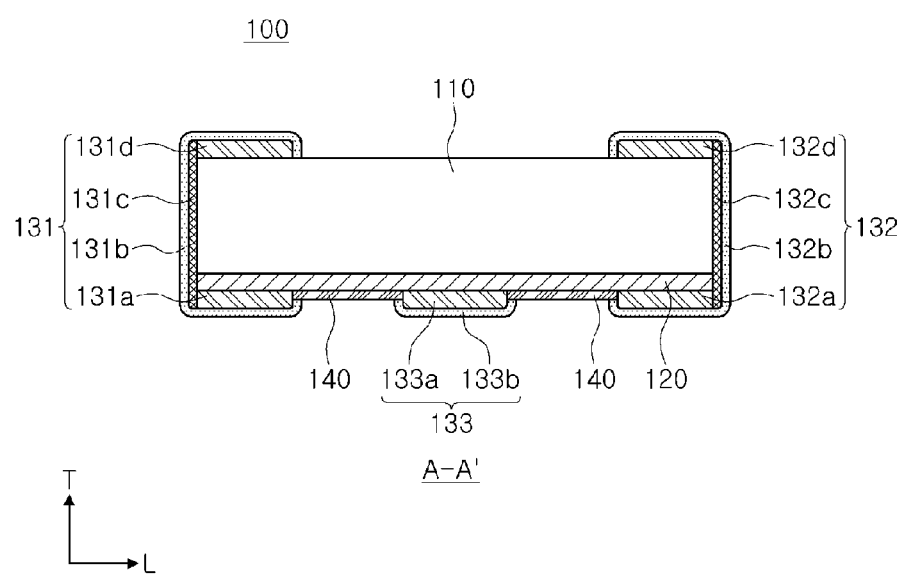
FIG. 2 is a cross-sectional view taken along line A-A' of FIG. 1.

FIG. 1 is a perspective view illustrating a resistor 100 according to an exemplary embodiment in the present disclosure, and FIG. 2 is a cross-sectional view taken along line A-A' of FIG. 1.

Referring to FIGS. 1 and 2, the resistor 100 according to the exemplary embodiment may include a base substrate 110, a resistance layer 120, first to third terminals 131 to 133 disposed on the resistance layer 120.

The base substrate 110, provided to support the resistance layer 120 and secure strength of the resistor 100, is not particularly limited. For example, an aluminum substrate, an insulating substrate, or the like, may be used as the base substrate 110.

Although not limited thereto, the base substrate 110 may be formed as a thin plate having a rectangular parallelepiped shape while being formed of an alumina material of which a surface is anodized to thereby be electrically insulating.

Further, as the base substrate 110 is formed of a material having excellent heat conductivity, the base substrate 110 may serve as a heat diffusion path by which heat generated in the resistance layer 120 during operating of the resistor is emitted externally.

The resistance layer 120, disposed on one surface of the base substrate 110, may include a first resistance portion connected to the first and third terminals 131 and 133 to form resistance and a second resistance portion connected to the second and third terminals 132 to 133 to form resistance.

According to the exemplary embodiment, the first and second resistance portions may be formed as a single integrated resistance layer.

Although not limited, the resistance layer 120 may contain Ag, Pd, Cu, Ni, a Cu—Ni based alloy, a Ni—Cr based alloy, a Ru oxide, a Si oxide, Mn and a Mn based alloy, or the like, as a main ingredient, and contain various materials depending on a required resistance value.

The first resistance portion may be formed between the first and third terminals 131 and 133 to adjust a current flowing in a circuit, and the second resistance portion may be formed between the second and third terminals 132 and 133 to adjust the current flowing in the circuit. The first and second resistance portions may use the third terminal 133 as a common terminal.

A circuit formed on a board may use a resistor in order to adjust a current, and may use two or more resistors or a resistor array in which each of the resistance portions is connected to a pair of independent terminals in order to prevent the circuit from being damaged due to a damage of the resistor by external impacts (surges, static electricity, or the like). However, in a case of using two or more resistors or the resistor array according to the related art, a mounting area may be increased.

According to the exemplary embodiment, a single resistor 100 may include three terminals 131 to 133 and two resistance portions disposed between two terminals, such that space-utilization efficiency may be improved by decreasing an area of a board on which the resistor is disposed as compared to a case of using two resistors each including a single resistance portion, or the resistor array in which each of the resistance portions is connected to the pair of independent terminals, thereby implementing miniaturization and precision in a device using the resistor 100 having the aforementioned structure.

That is, a three-terminal resistor 100 may be composed of two resistance portions, a single common terminal 133, and two respective unique terminals 131 and 132 of the first and second resistance portions, which results in substantially decreasing the number of terminals by one, whereby the resistor 100 may be miniaturized.

In the resistor 100 according to the exemplary embodiment, depending on a resistance value of one of the first and second resistance portions determined by trimming, a resistance value of the other resistance portion may be determined by continuously trimming the other resistance portion.

Trimming, an operation such as cutting for finely adjusting the resistance value, or the like, may be an operation of determining a resistance value set in each of the resistance portions at the time of designing a circuit.

According to the exemplary embodiment, errors in resistance values may be decreased as compared to a case of using two resistors or a resistor array.

The first to third terminals 131 to 133 may include first to third electrode layers 131a to 133a disposed on the resistance layer 120, respectively, and include first to third plating layers 131b to 133b disposed on the first to third electrode layers, respectively.

For example, as illustrated in FIG. 2, the first terminal 131 may include the first electrode layer 131a and the first plating layer 131b, the second terminal 132 may include the second electrode layer 132a and the second plating layer 132b, and the third terminal 133 may include the third electrode layer 133a and the third plating layer 133b.

The first to third electrode layers 131a to 133a may be disposed to be spaced apart from each other on one surface of the resistance layer 120, and the third electrode layer 133a may be disposed between the first and second electrode layers 131a and 132a.

Although not limited, the first to third electrode layers 131a to 133a may be formed by a method of applying a conductive paste for forming a conductive electrode on the resistance layer. In this case, as an application method, a screen printing method, or the like, may be used.

The first to third electrode layers 131a to 133a may be formed of a material which is different from that of the resistance layer 120 as described above. For example, copper, nickel, platinum, or the like, may be used therefor, and if necessary, a material which is the same as that of the resistance layer may be used.

Further, in the resistor 100 according to the exemplary embodiment, after the resistance layer 120 is formed on one surface of the base substrate 110, the first to third electrode layers 131a to 133a are formed on the resistance layer 120, thereby forming the first to third terminals 131 to 133. In this case, an area of the resistance layer may be increased as compared to a case of forming electrode layers on a base substrate and then forming a resistance layer to overlap the electrode layers.

According to the exemplary embodiment, the area of the resistance layer 120 may be increased by forming the electrode layer on the resistance layer 120 after forming the resistance layer 120, such that power characteristics of the resistor 100 may be increased, and overlapping areas between the resistance layer 120 and each of the first to third electrode layers 131a to 133a may become constant, thereby reducing resistance value distribution (non-uniformity).

Further, according to the exemplary embodiment, the resistance layer 120 may be formed of a resistance paste, wherein the resistance paste may contain glass. The glass contained in the resistance paste is not uniformly distributed in the resistance paste but sinks downwardly while the resistance paste is sintered after printing the resistance paste on the base substrate, such that the glass is mainly distributed in a region of the resistance layer adjacent to the base substrate 110.

According to the exemplary embodiment, on the basis of a virtual center line of the resistance layer in the thickness direction, a content of glass in a region adjacent to the base substrate is higher than a content of glass in the remaining half-region of the resistance layer in the thickness direction.

The glass may hinder flow of the current in the resistance layer, and in a case of forming a resistance layer by applying a resistance paste to an electrode layer after forming the electrode layer on a base substrate, unlike the exemplary embodiment, glass contained in the resistance paste may move toward an interface between the electrode layer and the resistance layer during sintering, thereby decreasing a movement path of the current through the interface between the electrode layer and the resistance layer, and hindering movement of the current. In a case in which glass hinders movement of a current as described above, R-drift, indicating a change in a resistance value, may be increased during the sintering.

However, in a case of disposing the resistance layer on the base substrate, and then disposing the electrode layer on the resistance layer as in the exemplary embodiment, glass may mainly be distributed in a region adjacent to an interface of the resistance layer and the base substrate while the resistance paste is sintered, thereby improving adhesive strength between the base substrate and the resistance layer.

Further, an amount of glass disposed at an interface of the resistance layer and the electrode layer may be decreased, such that R-drift may not be excessively high.

According to the exemplary embodiment in the present exemplary embodiment, a protection layer 140 for protecting the resistance layer 120 from external impacts may be disposed on a surface of the resistance layer 120 on which the first to third electrode layers 131a to 133a are not disposed.

Although not limited, the protection layer 140 may be formed of a silicone ($SiO_2$) or glass material and may be formed on the resistance layer 120 by over-coating.

In a case of disposing the electrode layers 131a to 133a on the resistance layer 120 as in the exemplary embodiment, with the protection layer 140 disposed on the resistance layer 120, the first to third terminals 131 to 133 may protrude further than the protection layer 140, such that it may be easy for the terminals 131 to 133 to contact electrode pads disposed on a board at the time of mounting the resistor on the board. Further, in a case of disposing the electrode layers 131a to 133a on the resistance layer 120 as in the exemplary embodiment, a contact area between a mounting surface of the board and the terminals may be increased due to an increase in an exposure area of the terminals at the time of mounting the resistor on the board, such that adhesive strength between the resistor and the board may be improved.

Figure 3:
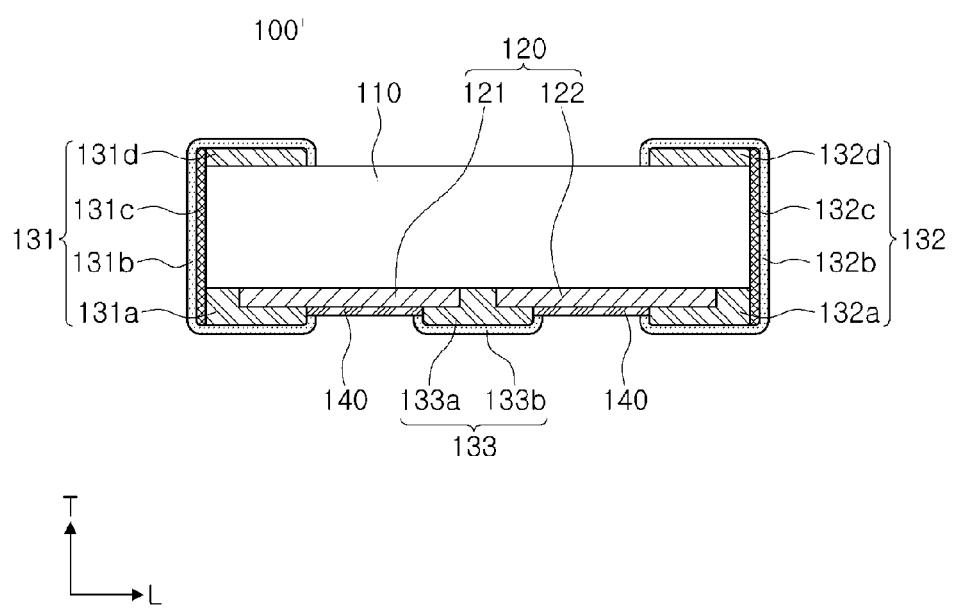
FIG. 3 is a cross-sectional view illustrating a resistor according to a modified exemplary embodiment in the present disclosure.

FIG. 3 is a schematic cross-sectional view illustrating a resistor 100' according to a modified exemplary embodiment in the present disclosure.

As illustrated in FIG. 3, according to the modified exemplary embodiment, a resistance layer 120 including first and second resistance layers 121 and 122 may be disposed on a base substrate 110, and first to third electrode layers 131a to 133a may be disposed on the resistance layer 120, but first and second resistance portions may be formed of two resistance layers disposed to be spaced apart from each other.

The first resistance portion may be formed of the first resistance layer 121 connected to the first and third electrode layers, and the second resistance portion may be formed of the second resistance layer 122 connected to the second and third electrode layers.

According to the modified exemplary embodiment, the first to third electrode layers 131a to 133a are not entirely disposed on the resistance layer 120, but portions of the first to third electrode layers 131a to 133a may be disposed on the resistance layer 120, and the other portions thereof may be disposed on the base substrate 110.

For example, as illustrated in FIG. 3, the first electrode layer 131a may cover one end portion of the first resistance layer 121 in the length direction and a portion of one surface of the base substrate 110 adjacent to one end portion of the first resistance layer 121 in the length direction, and the second electrode layer 132a may cover one end portion of the second resistance layer 122 in the length direction and a portion of one surface of the base substrate 110 adjacent to one end portion of the second resistance layer 122 in the length direction.

Further, the third electrode layer 133a may cover adjacent end portions of the first and second resistance layers 121 and 122 among end portions of the first and second resistance layers 121 and 122 in the length directions, and a portion of one surface of the base substrate 110 on which the first and second resistance layers are exposed to be spaced apart from each other.

In a case in which the first to third electrode layers are not entirely disposed on the resistance layer but portions thereof are disposed on the base substrate and portions thereof are disposed on the resistance layer as in the modified exemplary embodiment, when an electrode paste for forming an electrode layer contains glass, the glass mainly moves toward interfaces between the electrode layers and the base substrate rather than interfaces between the electrode layers and the resistance layer, such that R-drift generated in a manufacturing process of a resistor may be decreased.

Further, according to the modified exemplary embodiment, adhesive strength of the electrode layer may be improved by bringing the electrode layer and the base substrate into direct contact with each other.

According to the exemplary embodiment, the first to third plating layers 131b to 133b may be formed on the first to third electrode layers 131a to 133a, respectively, in order to mount the resistor on a board.

According to the exemplary embodiment, first and second rear-surface electrodes 131d and 132d may be selectively disposed on the other surface of the base substrate to face the first and second electrode layers 131a and 132a. In a case in which the first and second rear-surface electrodes 131d and 132d are disposed on the other surface of the base substrate 110 as described above, the first and second electrode layers 131a and 132a and the first and second rear-surface electrodes 131d and 132d may offset force applied to the base substrate 110 by the resistance layer during the sintering, such that warpage of the base substrate by the resistance layer may be prevented.

Although not limited, the first and second rear-surface electrodes 131d and 132d may be formed by printing a conductive paste.

According to the exemplary embodiment, a pair of end-surface electrodes 131c and 132c, respectively connected to the first and second electrode layers, may be disposed on both end surfaces of a multilayer body formed by disposing the base substrate 110, the resistance layer 120, and the first to third electrode layers 131a to 133a.

The multilayer body may selectively include the first and second rear-surface electrodes 131d and 132d as described above.

In a case in which the multilayer body includes the first and second rear-surface electrodes 131d and 132d, the pair of end-surface electrodes 131c and 132c may be disposed to connect the first electrode layer 131a and the first rear-surface electrode 131d to each other and connect the second electrode layer 132a and the second rear-surface electrode 132d to each other.

The pair of end-surface electrodes 131c and 132c may be formed by a method of sputtering a conductive material forming the end-surface electrodes 131c and 132c on the end surfaces of multilayer body.

In a case in which the first and second electrode layers 131a and 132a are formed to have a width narrower than that of the base substrate 110, both end portions of the first and second electrode layers 131a and 132a may be reinforced during the forming of the end-surface electrodes 131c and 132c.

In a case in which the resistor 100 according to the exemplary embodiment includes the rear-surface electrodes 131d and 132d and the end-surface electrodes 131c and 132c, plating layers 131b and 132b may be formed on the rear-surface electrodes and the end-surface electrodes.

For example, a first plating layer 131b may be formed to cover the first electrode layer 131a, the first rear-surface electrode 131d, and the end surface electrode 131c connecting the first electrode layer 131a and the first rear-surface electrode 131d to each other, and a second plating layer 131b may be formed to cover the second electrode layer 132a, the second rear-surface electrode 132d, and the end surface electrode 132c connecting the second electrode layer 132a and the second rear-surface electrode 132d to each other.

According to the exemplary embodiment, the area of the resistance layer may be increased by forming the electrode layer on the resistance layer, such that power characteristics of the resistor may be improved, and the overlapping areas between the electrode layer and the resistance layers may be constant, thereby decreasing resistance value distribution.

Further, since the electrode layer is disposed on an upper surface of the resistance layer, even in the case that the protection layer is formed on the resistance layer, it may be easy to secure a step between the protection layer and the terminal, and even in the case that the resistance paste contains glass, R-drift generated in a manufacturing process may be decreased.

Method of Manufacturing Resistor

Figure 4:
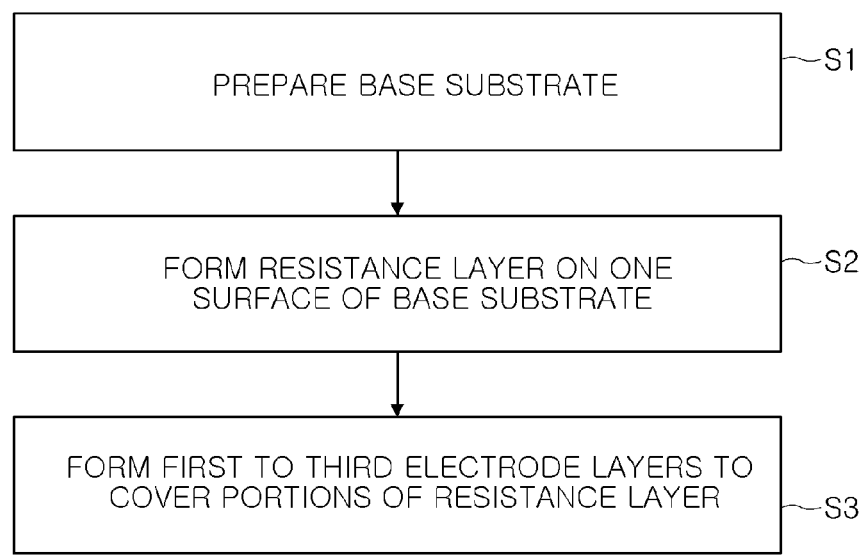
FIG. 4 is a flowchart illustrating a method of manufacturing a resistor according to another exemplary embodiment in the present disclosure.
Figure 5A:
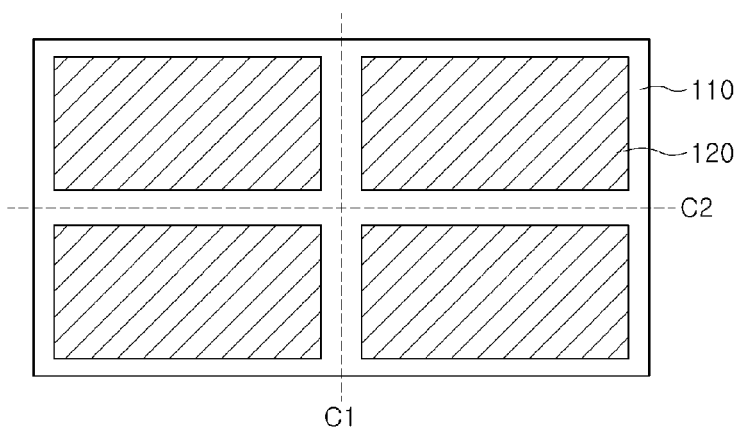
FIGS. 5A and 5B are plan views illustrating the method of manufacturing a resistor according to another exemplary embodiment in the present disclosure.
Figure 5B:
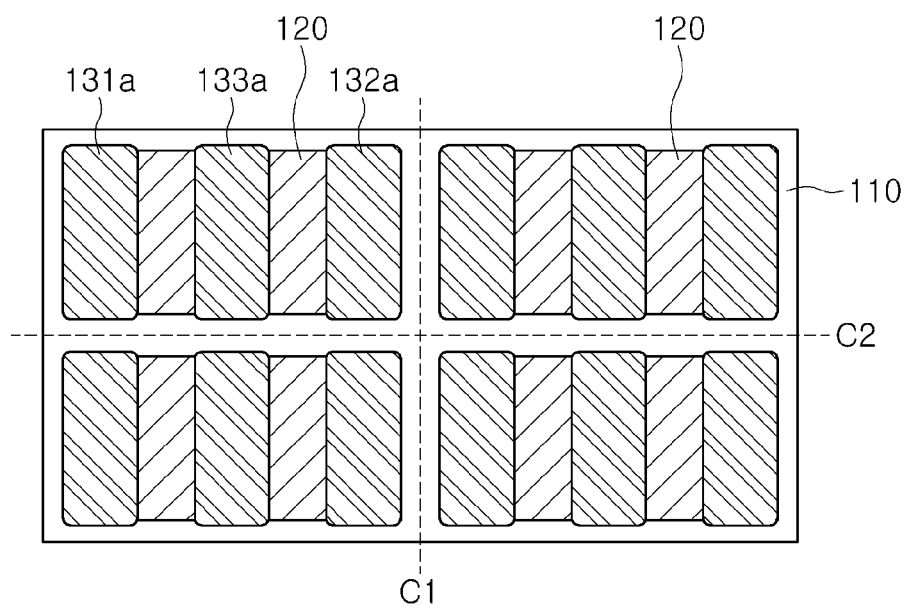

FIG. 4 is a flowchart illustrating a method of manufacturing a resistor according to another exemplary embodiment in the present disclosure, and FIGS. 5A and 5B are plan views illustrating operations of the method of manufacturing a resistor according to the exemplary embodiment.

Referring to FIG. 4, the method of manufacturing a resistor according to this exemplary embodiment may include preparing a base substrate (S1), forming a resistance layer on one surface of the base substrate (S2), and forming first to third electrode layers to cover portions of the resistance layer (S3).

Descriptions of features in the method of manufacturing a resistor according to this exemplary embodiment which are the same as those of the resistor according to the previous exemplary embodiment described above will be omitted.

First, as illustrated in FIG. 5A, after a base substrate 110 is prepared (S1), a resistance layer 120 may be formed on one surface of the base substrate 110 (S2), wherein the resistance layer 120 may be formed by printing a resistance paste.

As illustrate in FIG. 5A, the base substrate 110 may be prepared to have a size allowing a plurality of resistors to be formed thereon. Thereafter, the base substrate 110 may be cut along cutting lines C1 and C2, thereby forming individual resistors.

Alternatively, unlike the drawings, the resistance layer 120 may be disposed to be continuously formed in the length direction of the base substrate 110, and cut along the cutting line C1 to thereby be divided into individual resistance layers.

Next, as illustrated in FIG. 5B, first to third electrode layers 131a to 133a may be formed on the resistance layer 120 (S3).

As illustrated in FIG. 5B, the first to third electrode layers may be formed to be individually spaced apart from each other.

Alternatively, unlike the drawings, the second electrode layer 132a may be formed integrally with a first electrode layer 131a of an individual resistor adjacent thereto along the cutting line C1, and divided into first and second electrode layers of respective resistors at the time of cutting the base substrate along the cutting line C1.

Next, the method of manufacturing a resistor may further include performing a trimming operation of measuring resistance values of first and second resistance portions disposed between the first to third electrode layers on the basis of individual resistors formed after the cutting and adjusting the resistance values.

Then, the method of manufacturing a resistor may further include forming a protection layer on exposed portions of the resistance layer that is not covered by the first to third electrode layers.

Next, the method of manufacturing a resistor may further include cutting the base substrate on which the resistance layer, the first to third electrode layers, and the protection layer are formed along the cutting line C1 and then forming end-surface electrodes.

The end-surface electrodes may be formed by a sputtering method.

Thereafter, the method of manufacturing a resistor may further include cutting the base substrate 110 on which the resistance layer 120, the first to third electrode layers 131a to 133a, the protection layer, conductive resin electrodes, and the end-surface electrodes are formed along the cutting line C2 and then forming first to third plating layers 131b to 133b on the first to third electrode layers.

Figure 6A:
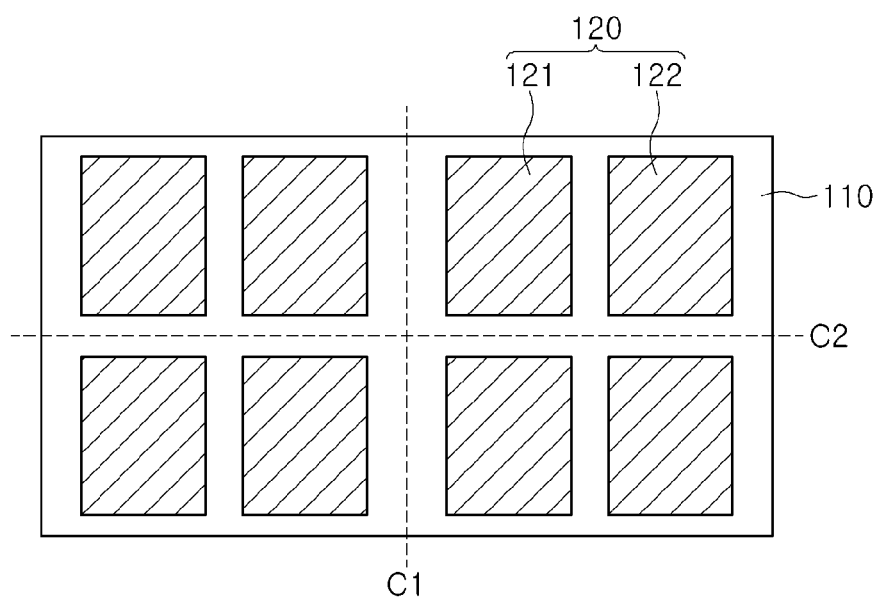
FIGS. 6A and 6B are plan views illustrating a method of manufacturing a resistor according to a modified exemplary embodiment in the present disclosure.
Figure 6B:
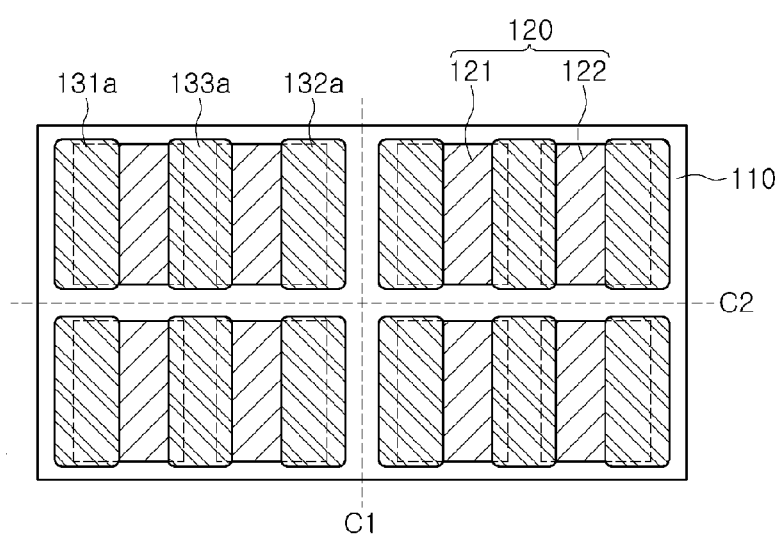

FIGS. 6A and 6B are plan views illustrating operations in a method of manufacturing a resistor according to a modified exemplary embodiment in the present disclosure.

First, as illustrated in FIG. 6A, after a base substrate 110 is prepared, a resistance layer 120 may be formed on one surface of the base substrate 110, wherein the resistance layer may be formed by printing a resistance paste.

A cut body obtained by cutting the base substrate along cutting lines C1 and C2 in FIG. 6A may form a single resistor, and the resistance layer 120 may be formed of two resistance layers distinguished from each other within the single resistor.

Next, as illustrated in FIG. 6B, first to third electrode layers may be formed on the resistance layers so that the first to third electrode layers 131a to 133a are partially in directly contact with the base substrate 110.

In the present modified exemplary embodiment, descriptions overlapping those of the method of manufacturing a resistor according to the previous exemplary embodiment described above will be omitted.

Board Having Resistor

Figure 7:
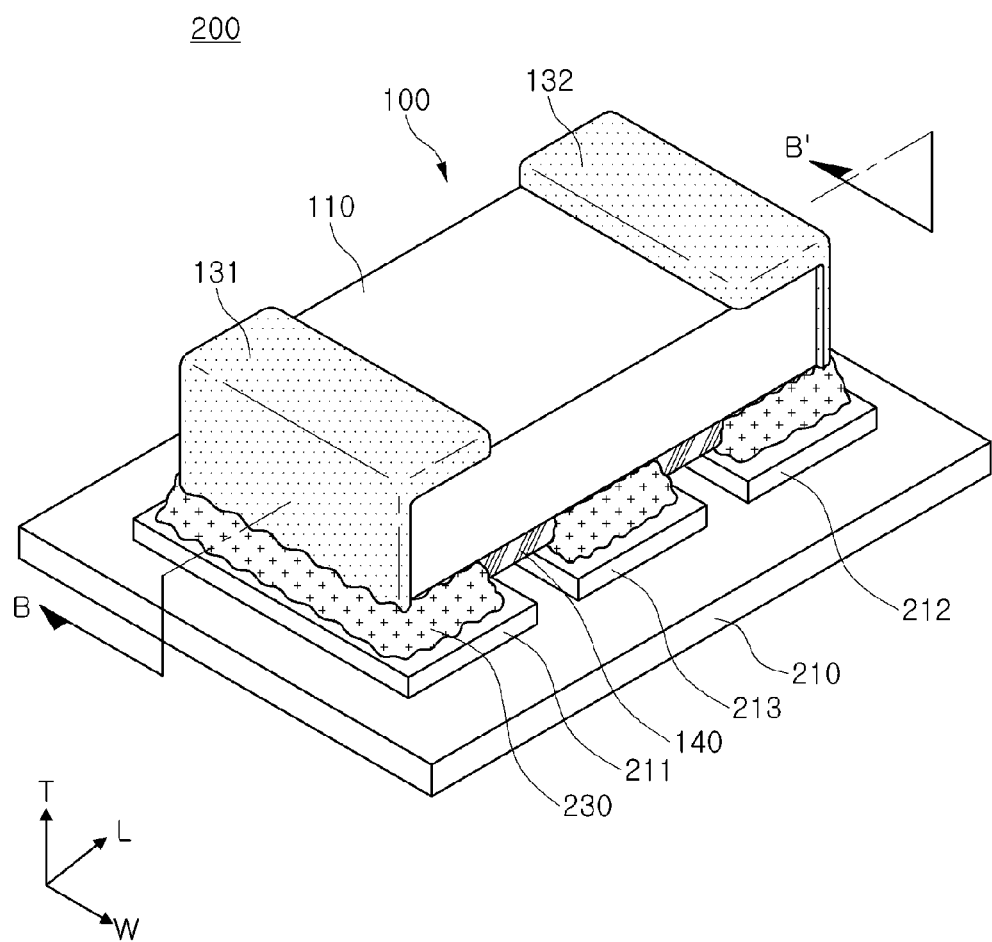
FIG. 7 is a perspective view illustrating a board having a resistor according to another exemplary embodiment in the present disclosure.
Figure 8:
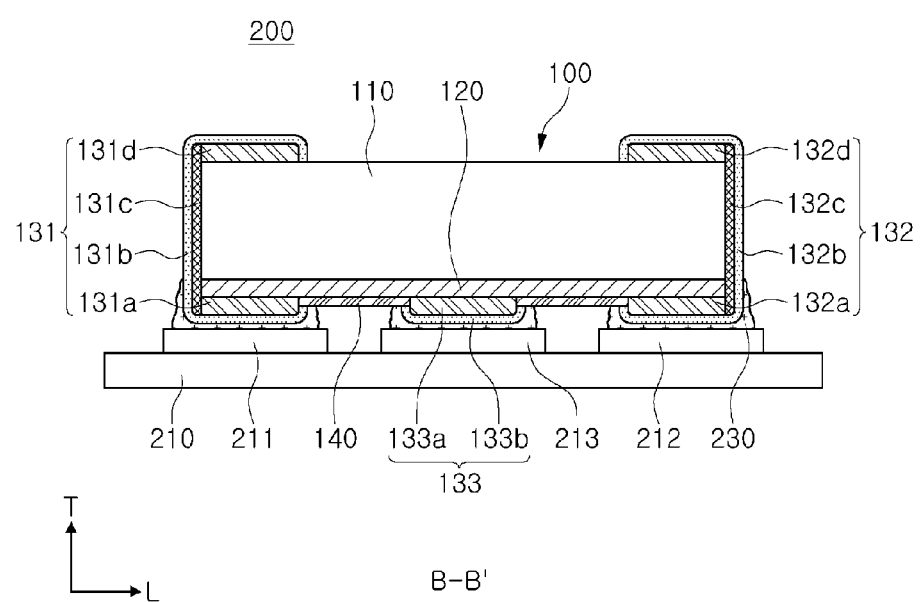
FIG. 8 is a cross-sectional view taken along line B-B' of FIG. 7.

FIG. 7 is a perspective view illustrating a board having a resistor according to another exemplary embodiment in the present disclosure, and FIG. 8 is a cross-sectional view taken along line B-B' of FIG. 7.

Referring to FIG. 7, a board 200 having a resistor according to the present exemplary embodiment may include a resistor 100 and a circuit board 210 of which an upper surface is provided with first to third electrode pads which are disposed to be spaced apart from each other.

The resistor 100 may include a base substrate, a resistance layer disposed on one surface of the base substrate, first and second electrode layers disposed to be spaced apart from each other and covering portions of the resistance layer, and a third electrode layer disposed between the first and second electrode layers to be spaced apart from the first and second electrode layers and covering a portion of the resistance layer.

Since descriptions of the features of the resistor 100 overlap the descriptions of those of the resistor according to the previous exemplary embodiment, details thereof will be omitted.

Figure 9:
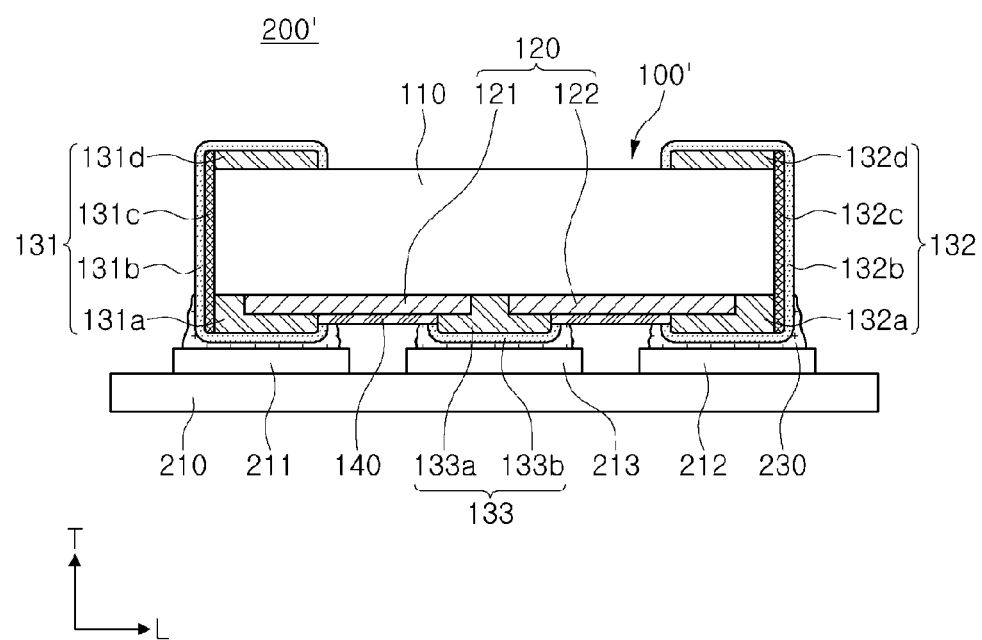
FIG. 9 is a cross-sectional view illustrating a board having a resistor according to a modified exemplary embodiment in the present disclosure.

FIG. 9 is a cross-sectional view illustrating a board 200' having a resistor according to a modified exemplary embodiment in the present disclosure. Since a description of the resistor mounted in the board 200' illustrated in FIG. 9 overlaps the description of the resistor 100' according to the modified exemplary embodiment described above, details thereof will be omitted.

An electronic circuit may be formed on the circuit board 210, and an integrated circuit (IC) for a specific operation or for control of an electronic device, or the like, may be formed thereon, such that a current supplied from a separate power supply may flow freely.

In this case, the circuit board 210 may include various wiring lines or may further include different kinds of semiconductor elements such as a transistor, or the like. In addition, the circuit board 210 may be variously composed. That is, if necessary, the circuit board 210 may include a conductive layer, a dielectric layer, or the like.

The first to third electrode pads 211 to 213, disposed to be spaced apart from each other on the circuit board 210, may be connected to the first to third terminals of the resistor.

The first to third terminals may be electrically connected to the electronic circuit through the first to third electrode pads, such that the first and second resistance portions formed between the first to third terminals may be connected to the electronic circuit.

As set forth above, according to exemplary embodiments in the present disclosure, a resistor having excellent space-utilization efficiency when being mounted on a board, having reduced non-uniformity in resistance value, and having strong power, a method of manufacturing the same, and a board having the same may be provided.

Further, according to exemplary embodiments, the resistor capable of decreasing changes in a resistance value generated in the manufacturing process and improving adhesive strength between the elements in the resistor, the method of manufacturing the same, and the board having the same may be provided.

While exemplary embodiments have been shown and described above, it will be apparent to those skilled in the art that modifications and variations could be made without departing from the scope of the present invention as defined by the appended claims.

What is claimed is:

1. A resistor comprising:
   a base substrate;
   an integral resistance layer covering first and second regions of the base substrate and continuously extending between the first and second regions of the base substrate;
   first and second electrode layers disposed to be spaced apart from each other and respectively covering portions of the integral resistance layer formed on the first and second regions of the base substrate; and
   a third electrode layer disposed between the first and second electrode layers to be spaced apart from the first and second electrode layers and covering a portion of the integral resistance layer between the portions of the integral resistance layer covered by the first and second electrode layers,
   wherein a first resistance portion of the integral resistance layer electrically connecting the first electrode layer and the third electrode layer to each other and a second resistance portion of the integral resistance layer electrically connecting the second electrode layer and the third electrode layer to each other are formed of a same material.

2. The resistor of claim 1, wherein the first to third electrode layers are disposed on one surface of the integral resistance layer.

3. The resistor of claim 1, wherein the first to third electrode layers are disposed after the integral resistance layer is formed.

4. The resistor of claim 1, wherein the integral resistance layer comprises:
   a first resistance portion connected to a first terminal including the first electrode layer and a third terminal including the third electrode layer to form resistance; and
   a second resistance portion connected to a second terminal including the second electrode layer and the third terminal to form resistance, and
   in accordance with a resistance value of one of the first and second resistance portions determined by trimming, a resistance value of the other portion of the first and second resistance portions is determined by trimming the other portion of the first and second resistance portions.

5. The resistor of claim 1, further comprising a protection layer disposed on a surface of the integral resistance layer exposed among the first to third electrode layers.

6. A method of manufacturing a resistor, the method comprising:
   preparing a base substrate;
   forming a resistance layer on one surface of the base substrate; and
   forming first to third electrode layers to cover portions of the resistance layer,
   wherein a first resistance portion of the resistance layer electrically connecting the first electrode layer and the third electrode layer to each other and a second resistance portion of the resistance layer electrically connecting the second electrode layer and the third electrode layer to each other are formed of a same material.

7. The method of claim 6, wherein the first to third electrode layers are formed on one surface of the resistance layer.

8. The method of claim 6, wherein the resistance layer is an integral layer covering first and second regions of the base substrate and continuously extending between the first and second regions of the base substrate, and
   the first and second electrode layers are formed to be spaced apart from each other and respectively covering portions of the resistance layer formed on the first and second regions of the base substrate.

9. The method of claim 6, wherein
   the first and second resistance portions are disposed to be spaced apart from each other.

10. The method of claim 6, further comprising forming a protection layer disposed on a surface of the resistance layer exposed among the first to third electrode layers.

11. A resistor comprising:
    a base substrate;

first and second resistance layers disposed spaced apart from each other on one surface of the base substrate;

first and second electrode layers disposed to be spaced apart from each other and electrically connected to the first and second resistance layers, respectively;

a third electrode layer disposed between the first and second electrode layers to be spaced apart from the first and second electrode layers and covering portions of the first and second resistance layers so as to electrically connected to the first and second resistance layers; and a protection layer disposed on surfaces of the first and second resistance layers exposed among the first to third electrode layers.

12. The resistor of claim 11, wherein the first electrode layer covers one end portion of the first resistance layer in a length direction of the base substrate and a portion of the one surface of the base substrate adjacent to the one end portion of the first resistance layer, and the second electrode layer covers one end portion of the second resistance layer in the length direction of the base substrate and a portion of the one surface of the base substrate adjacent to the one end portion of the second resistance layer.

13. The resistor of claim 12, wherein the third electrode layer covers the other end portion of the first resistance layer in the length direction of the base substrate, the other end portion of the second resistance layer in the length direction of the base substrate, and a portion of the one surface of the base substrate exposed between the first and second resistance layers.

14. The resistor of claim 11, wherein the first and second resistance layers are formed of a same material.

* * * * *